United States Patent
Liu et al.

(10) Patent No.: US 9,024,451 B2
(45) Date of Patent: May 5, 2015

(54) INTEGRATED LIGHTING APPARATUS AND METHOD OF MANUFACTURING THE SAME

(71) Applicant: Epistar Corporation, Hsinchu (TW)

(72) Inventors: Hsin-Mao Liu, Hsinchu (TW);
Min-Hsun Hsieh, Hsinchu (TW);
Tzer-Perng Chen, Hsinchu (TW);
Meng-Yuan Hong, Hsinchu (TW);
Cheng Nan Han, Hsinchu (TW);
Tsung-Xian Lee, Hsinchu (TW);
Ta-Cheng Hsu, Hsinchu (TW);
Chih-Chiang Lu, Hsinchu (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 14/466,284

(22) Filed: Aug. 22, 2014

(65) Prior Publication Data

US 2014/0361319 A1    Dec. 11, 2014

Related U.S. Application Data

(63) Continuation of application No. 13/186,812, filed on Jul. 20, 2011, now Pat. No. 8,816,508.

(51) Int. Cl.
*H01L 23/48* (2006.01)
*H01L 23/52* (2006.01)
*H01L 29/40* (2006.01)
*H01L 33/62* (2010.01)
*H01L 25/16* (2006.01)
*H01L 27/15* (2006.01)

(52) U.S. Cl.
CPC ............. *H01L 33/62* (2013.01); *H01L 25/167* (2013.01); *H01L 2924/0002* (2013.01); *H01L 27/153* (2013.01)

(58) Field of Classification Search
None
See application file for complete search history.

(56) References Cited

U.S. PATENT DOCUMENTS

| | | | | |
|---|---|---|---|---|
| 4,774,205 A | * | 9/1988 | Choi et al. | 438/23 |
| 5,003,357 A | * | 3/1991 | Kim et al. | 257/98 |
| 5,780,321 A | * | 7/1998 | Shieh et al. | 438/34 |
| 5,940,683 A | * | 8/1999 | Holm et al. | 438/23 |
| 6,097,748 A | * | 8/2000 | Huang et al. | 372/50.124 |
| 7,994,518 B2 | * | 8/2011 | Wang et al. | 257/82 |
| 2010/0006864 A1 | * | 1/2010 | Steigerwald | 257/88 |
| 2011/0057209 A1 | * | 3/2011 | Kim | 257/88 |

* cited by examiner

*Primary Examiner* — Andres Munoz
(74) *Attorney, Agent, or Firm* — Ditthavong & Steiner, P.C.

(57) ABSTRACT

An integrated lighting apparatus comprises a first control device including a semiconductor substrate, an integrated circuit block formed above a first portion of the semiconductor substrate, and a plurality of power pads formed above the integrated circuit block; a first light emitting device formed above a second portion of the semiconductor substrate; and a through plug passing through the semiconductor substrate for electrically connecting the first control device and the first light emitting device.

9 Claims, 15 Drawing Sheets

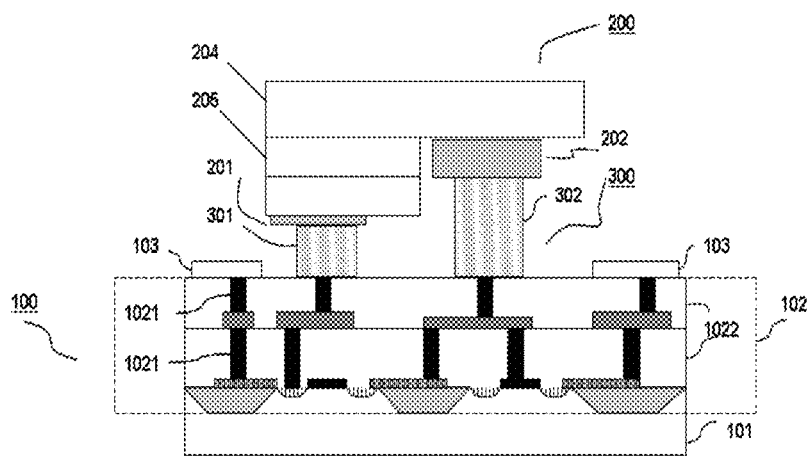
FIG. 5A
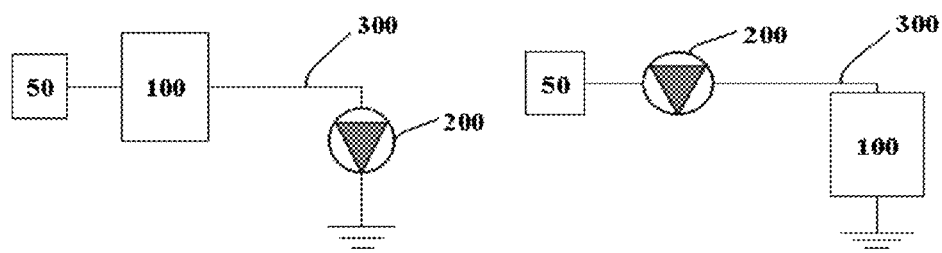
FIG. 5B
FIG. 5C

INTEGRATED LIGHTING APPARATUS AND METHOD OF MANUFACTURING THE SAME

RELATED APPLICATION

This application is a continuation application of U.S. patent application Ser. No. 13/186,812, filed Jul., 20, 2011.

TECHNICAL FIELD

The application relates to the field of lighting apparatus, and more specifically, to integrated lighting apparatus and the manufacturing method thereof.

BACKGROUND

As the developing of the technology to integrate the light emitting devices and other components, how to adopt the light emitting diodes (LEDs) in various apparatus becomes an interesting topic because of LED's small size and low power consumption which are suitable for many applications. At present, the packaged light-emitting diodes are integrated with an external control component such as PCB circuit board for the main body, and then illuminates when the LED is controlled and driven by the external control. However, the integration device is too large to meet the current requirement for the electronic products which is light, thin, short, small, and have the extendable module applications.

SUMMARY

The present disclosure provides a novel structure and the manufacturing method thereof for reducing the volume of the integrated light emitting apparatus.

An integrated lighting apparatus comprises a first control device including a semiconductor substrate, an integrated circuit block formed above a first portion of the semiconductor substrate, and a plurality of power pads formed above the integrated circuit block; a first light emitting device formed above a second portion of the semiconductor substrate; and a through plug passing through the semiconductor substrate for electrically connecting the first control device and the first light emitting device.

BRIEF DESCRIPTION OF THE DRAWINGS

FIGS. 5A to 5C illustrates an integrated lighting apparatus according to one embodiment of the present disclosure.

DETAILED DESCRIPTION OF PREFERRED EMBODIMENTS

Figure 1:
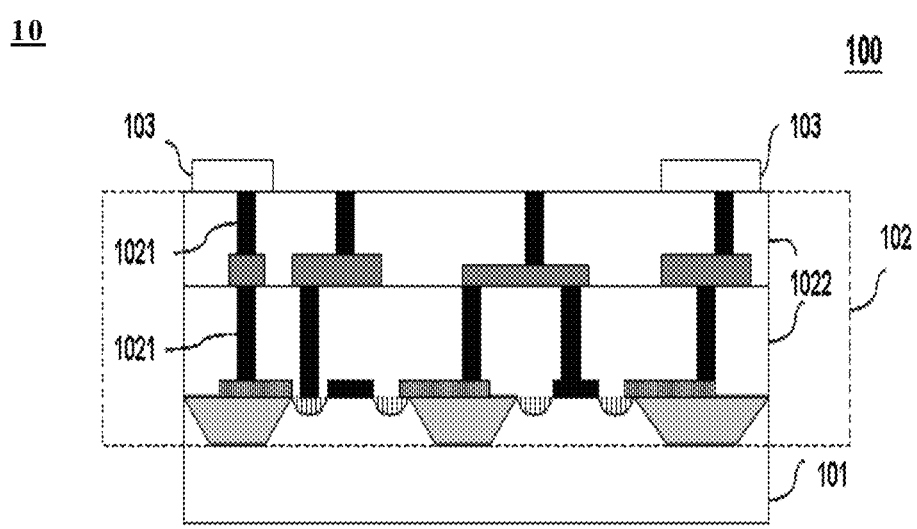
FIG. 1 illustrates an integrated lighting apparatus according to one embodiment of the present disclosure.

FIG. 1 shows a schematic view of a control device 100 including a semiconductor substrate 101, an integrated circuit block 102 and a plurality of power pads 103, wherein the integrated circuit block 102 is formed on the semiconductor substrate 101 and the power pads 103 are formed on the integrated circuit block 102. The integrated circuit block 102 includes a plurality of plugs 1021 and a dielectric block 1022. The material of the semiconductor substrate 101 can be semiconductor whose band gap is between the insulator and conductor, for example, silicon (Si), germanium (Ge), GaN, GaAs, and so on. The method for forming the integrated circuit block 102 can be semiconductor manufacturing technology such as photolithography process, etching process, thin film process, diffusion process, and ion implantation process, and so on.

Figure 2:
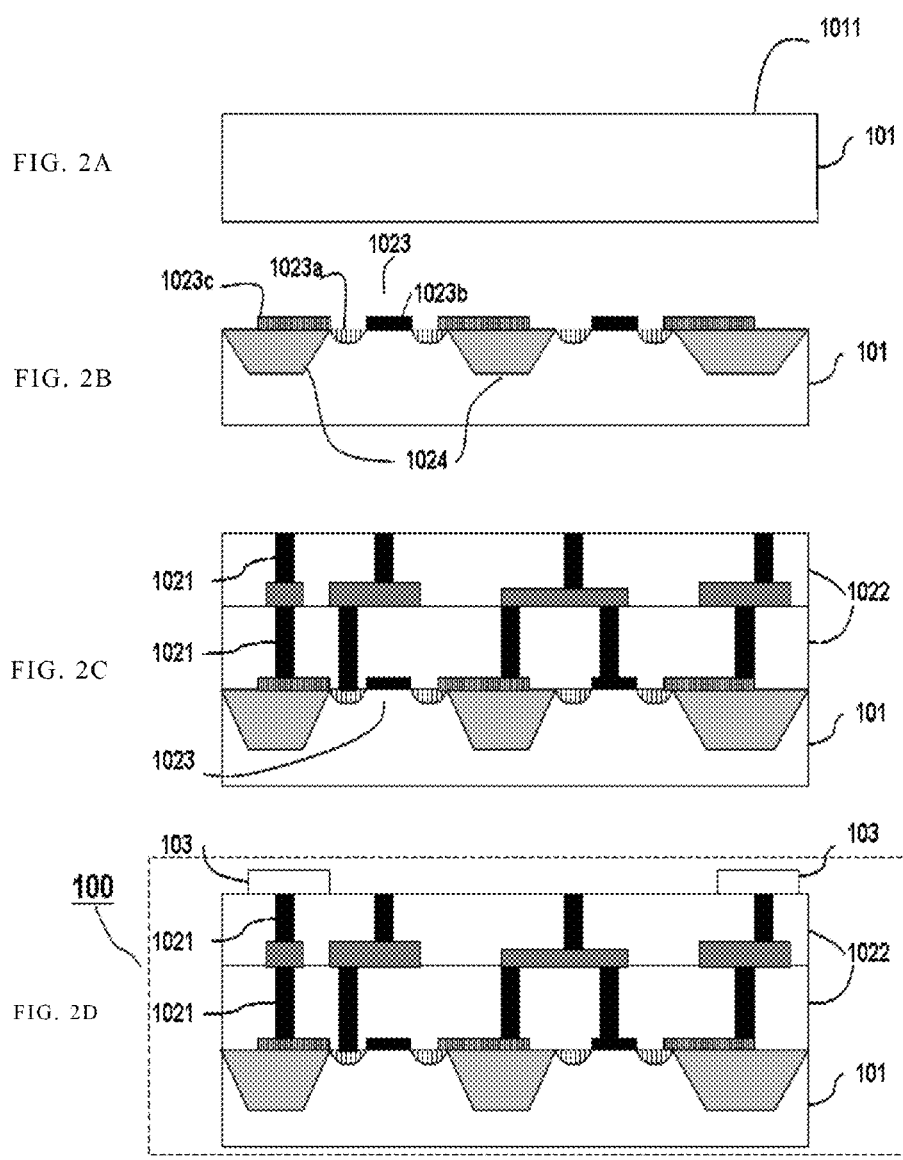
FIGS. 2A to 2D illustrate the corresponding structures fabricated by the manufacturing method according to one embodiment of the present disclosure.

FIGS. 2A-2D further describe the method for manufacturing the integrated circuit block 102. With reference to FIG. 2A, the semiconductor substrate 101 has a surface 1011. FIG. 2B shows a plurality of solid-state control units 1023 and separation zones 1024 formed on the surface 1011, wherein any one of the solid-state control units 1023 includes at least one dopant area 1023a, at least one gate 1023b and at least one connection pad 1023c. The solid-state control unit 1023 can be field-effect transistor (MOSFET), diode, programmable components (FPGA), bipolar junction transistors (BJT), insulated gate bipolar transistor (IGBT), junction FET (JFET) and so on. Then, the dielectric block 1022 and the plugs 1021 are formed on the semiconductor substrate 101 by chemical vapor deposition (CVD) or spin coating technologies as shown in FIG. 2C. The dielectric block 1022 includes one or more than one dielectric layer, wherein the material of dielectric block 1022 can be silicon oxide (SiO$_x$), silicon nitride (SiN$_x$), titanium dioxide (TiO$_x$), FSG (Fluorosilicate Glass), PSG (Phosphosilicate Glass), BPSG (Borophosphosilicate Glass), aluminum oxide (AlO$_x$), and so on. The plugs 1021 electrically connect with the solid-state control units 1023. FIG. 2D shows a control device 100 having a plurality of power pads 103 formed on the integrated circuit block 102. The control device 100 is a logic circuit, and when applying an external power source, such as DC power source, the current flows through the power pads 103 into the solid-state control units 1023 of the integrated circuit block 102. The control device 100 operates according to the design of circuit.

Figure 3:
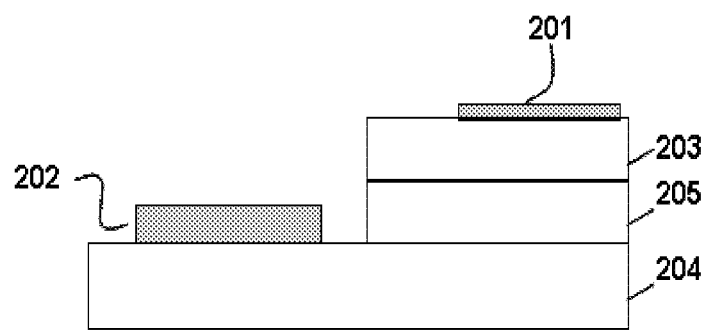
FIG. 3 is a schematic view showing a light emitting diode.

FIG. 3 shows a schematic view of a light emitting device 200, wherein the light emitting device 200 can be a light-emitting diode, a laser, a SoC (System on Chip) LED, or a combination of the devices mentioned above. In this embodiment, the light emitting device 200 is a light-emitting diode. The light-emitting device 200 includes a first electrode 201, a second electrode 202, a first semiconductor layer 203, a second semiconductor layer 204, and an active layer 205. In order to improve the light extraction efficiency, a reflective layer and current spreading layer (not shown) can be optionally formed in the light-emitting diode 200. The method for manufacturing the light emitting device 200 is well known on a growth substrate (not shown). The material of the semiconductor layers and the active layer can be III-V semiconductor materials, such as the series of AlGaInP like AlGaInP or AlInP; the series of GaN like MN, GaN, AlGaN, InGaN, AlInGaN; II-VI semiconductor materials like ZnSe, ZnSeCr, ZnSeTe, ZnS, CdSe, and so on.

Figure 4A:
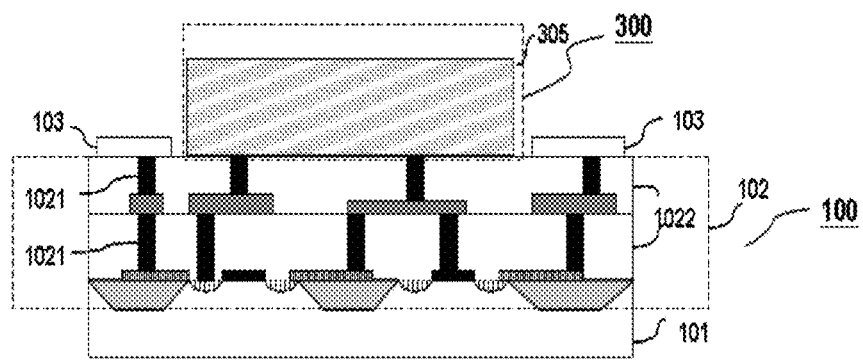
FIGS. 4A to 4C illustrate the corresponding structures of a connector fabricated by the manufacturing method according to one embodiment of the present disclosure.
Figure 4B:
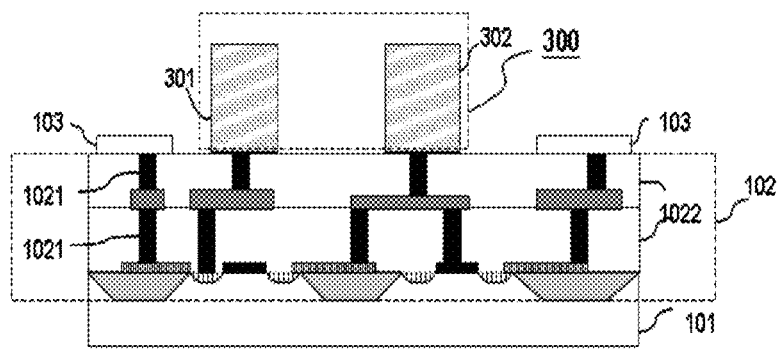
Figure 4C:
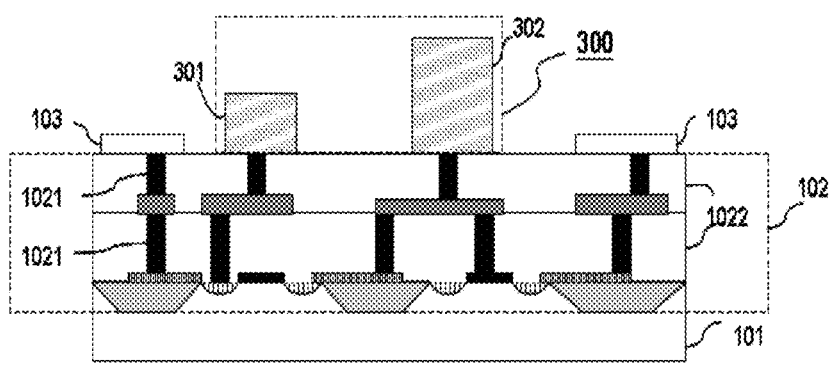

FIG. 4 shows a connector 300 fabricated by the manufacturing method according to one embodiment of present disclosure. With reference to FIG. 4A, a conductive thin film 305 is formed on the integrated circuit block 102 by thin film deposition process. Next, a portion of the conductive thin film 305 are removed by photolithography and etching process to form a connector 300 containing a first conductive region 301 and a second conductive region 302, as shown in FIG. 4B. The first conductive region 301 and second conductive region 302 can be optionally formed with different thickness by photolithography and etching process, as shown in the FIG. 4C. The first conductive region 301 and second conductive region 302 are electrically connected to the plugs 1021 in the control device 100 respectively.

FIG. 5A shows a schematic view of an integrated light-emitting device 10A, which is the combination of the control device 100, the light emitting device 200, and the connector 300. In this embodiment, the first conductive region 301 is electrically connected to the first electrode 201, and the second conductive region 302 is electrically connected to the second electrode 202, wherein the first conductive region 301 and the second conductive region 302 of the connector 300 can be bonded to the first electrode 201 and second electrode 202 of the light emitting device 200. In this embodiment, the connector 300 further includes an insulating region (not shown in the figure) surrounding the first conductive region 301 and the second conductive region 302 to avoid electrical interference with the environment and to improve mechanical strength of light-emitting device 10A. The insulating region is formed by CVD or spin coating process, wherein the material of the insulating region can be silicon oxide ($SiO_x$), silicon nitride ($SiN_x$), titanium dioxide (TiOx), FSG, PSG, BPSG, or aluminum oxide ($AlO_x$), and so on. The insulating region also can be formed by filling aliphatic polyimide, benzocyclobutane, prefluroic cyclobutane, or epoxide resin surrounding the first conductive region 301 and the second conductive region 302.

An external DC power source 50 generates current flowing through the power pad 103 into the light emitting device 10A. FIG. 5B and FIG. 5C show the equivalent circuit diagram, which using the control device 100 as a source and the light emitting device 200 as a drain, or the control device 100 as a drain and the light emitting device 200 as a source. The connector 300 is a circuit electrically connected the control device 100 and light-emitting device 200. The control device 100 can be designed as a chip of the size of several millimeters to several centimeters, then using the control device 100 to control and drive the light emitting device 200. The integrated light-emitting device 10A has smaller size and the method for manufacturing the integrated light-emitting device 10A is easier.

The integrated circuit block 102 can be designed as a control device having functions such as rectification, amplification, and other different functions. Taking the wireless device which requires a compact size as an example, an integrated light emitting device 10A is formed by combining the light emitting device 200 in a backlight source of the display module and the control device 100 through the connector 300, wherein the control device 100 is the major circuit of the wireless device. In this wireless device, the current of the light emitting device 200 is adjusted by the control device 100 for changing the brightness of the display module. The control device 100 can be designed as a rectifier to convert alternating current to direct current, so the integrated light emitting device 10A can use AC power directly.

Figure 6:
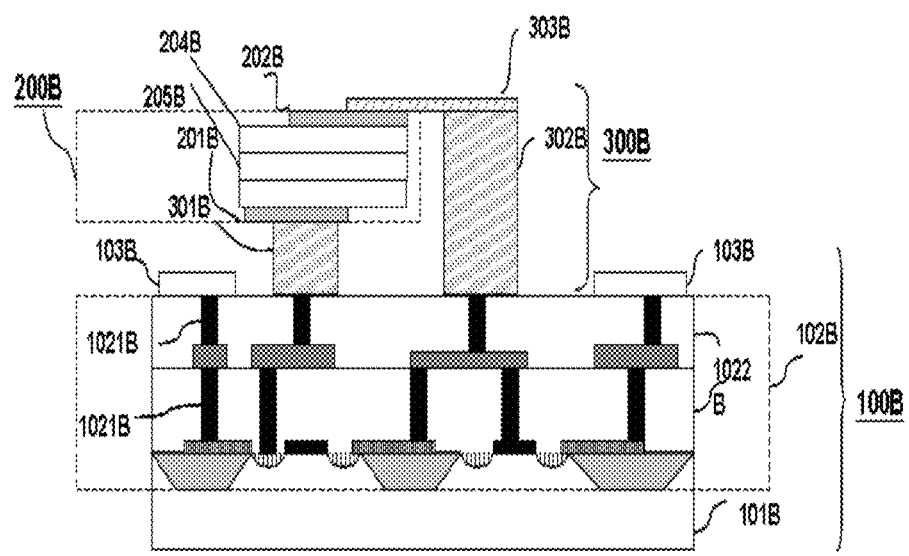
FIG. 6 illustrates an integrated lighting apparatus according to one embodiment of the present disclosure.

FIG. 6 shows a schematic view of a combination of a control device 100B, a light emitting device 200B, and a connector 300B according to a second embodiment of the present disclosure. The structure and the method for manufacturing the control device 100B are the same with what is disclosed in the first embodiment. The light emitting device 200B is a vertical type light emitting diode including a first electrode 201B, a second electrode 202B, a second semiconductor layer 204B, and an active layer 205B. The connector 300B includes a first conductive region 301B, a second conductive region 302B, and a conduction bridge 303B. The first electrode 201B of the light emitting device 200B is electrically connected to the first connective region 301B of the conductive region 300B. The second electrode 202B of the light emitting device 200B is electrically connected to the second connector 302B through the bridge 303B. The electrical bridge 303B can be a metal wire. In this embodiment, the connector 300B further includes an insulating region (not shown) surrounding the first conductive region 301B and the second conductive region 302B in order to avoid electrical interference with the environment and to improve the mechanical strength of the integrated light emitting device 10B. The insulating region is formed by CVD or spin coating process, wherein the material of the insulating region can be silicon oxide ($SiO_x$), silicon nitride ($SiN_x$), titanium dioxide ($TiO_x$), FSG, PSG, BPSG, or aluminum oxide ($AlO_x$), and so on. The insulating region also could be formed by filling aliphatic polyimide, benzocyclobutane, prefluroic cyclobutane or epoxide resin surrounding the first conductive region 301B and the second conduction region 302B.

Figure 7:
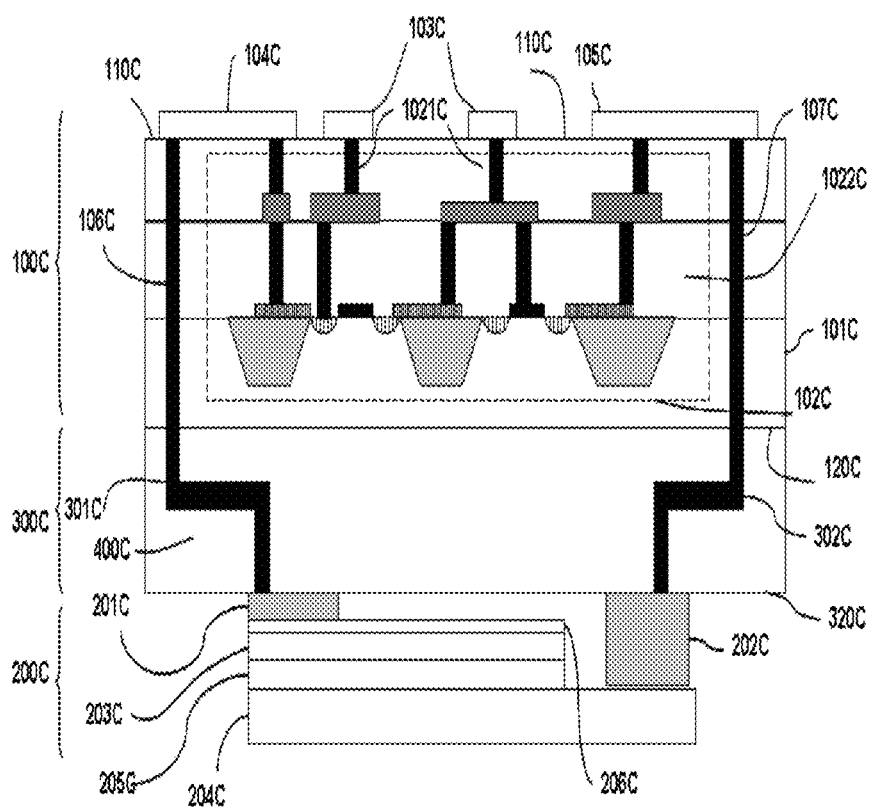
FIG. 7 illustrates an integrated lighting apparatus according to another embodiment of the present disclosure.

FIG. 7 shows a schematic view of a structure of the integrated light emitting device 10C according to a third embodiment of present disclosure. The integrated light-emitting device 10C includes a control device 100C, a connector 300C, and a light emitting device 200C, wherein the control device 100C includes a semiconductor substrate 101C, an upper surface 110C, a lower surface 120C, an integrated circuit block 102C, a plurality of power pads 103C, a first connection pad 104C, a second connection pad 105C, a first through plug 106C, and a second through plug 107C. The integrated circuit block 102C includes a plurality of plugs 1021C and a dielectric block 1022C. The first connection pads 104C, the second connection pads 105C, and power pads 103C are formed on the upper surface 110C of the control device 100C. The first through plug 106C and a second through plug 107C extend from the upper surface 110C to the lower surface 120C of the control device 110C, the first through plug 106C and the second through plug 107C are electrically connected to the first connection pad 104C and the second connection pad 105C, respectively. The dielectric block 1022C can contain one or more dielectric layers, wherein the material of the dielectric block 1022C could be silicon oxide ($SiO_x$), silicon nitride ($SiN_x$), titanium dioxide ($TiO_x$), FSG, PSG, BPSG, or alumina ($AlO_x$), and so on. The method for manufacturing includes CVD, spin coating, and so on. The first connection pad 104C, the second connection pad 105C, and the power pad 103C are made in the same steps. The light emitting device 200C can be a light emitting diode, a laser, or an SOC emitting diodes. In this embodiment, a light emitting diode 200C comprises a first electrode 201C, a second electrode 202C, a first semiconductor layer 203C, a second semiconductor layer 204C, and an active layer 205C. A reflective layer 206C can be optionally formed in the integrated light-emitting device 10C to increase the light emitting efficiency.

The connector 300C includes a first conductive region 301C, a second conductive region 302C, an insulating region 400C, and a first connection surface 320C. The method for manufacturing the connection region 300C comprises the steps of forming the first conductive region 301C, the second conductive region 302C, and the insulating region 400C on the lower surface 120C of control device 100C by processes like photolithography, etching, and thin film deposition. The material of the first conductive region 301C and the second conductive region 302C can be metal, metal compounds and a combination thereof. The material of insulating region 400C can be silicon oxide ($SiO_x$), silicon nitride ($SiN_x$), titanium dioxide ($TiO_x$), FSG, PSG, BPSG, or aluminum oxide ($AlO_x$), and so on. The method for manufacturing insulating region 400C comprises CVD, spin coating, filling techniques, and so on. The first conductive region 301C is electrically connected to the first through plug 106C, and the second conductive region 302C is electrically connected to the second through plug 107C.

Figure 8A:
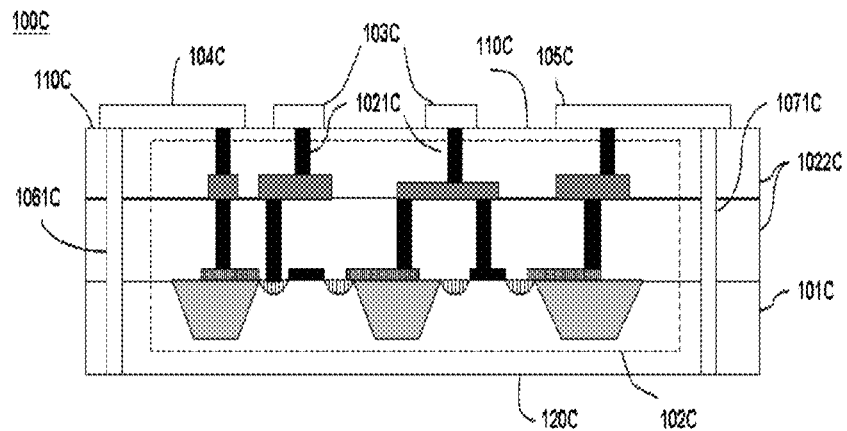
FIGS. 8A to 8B illustrate the corresponding structures fabricated by the manufacturing method according to one embodiment of the present disclosure
Figure 8B:
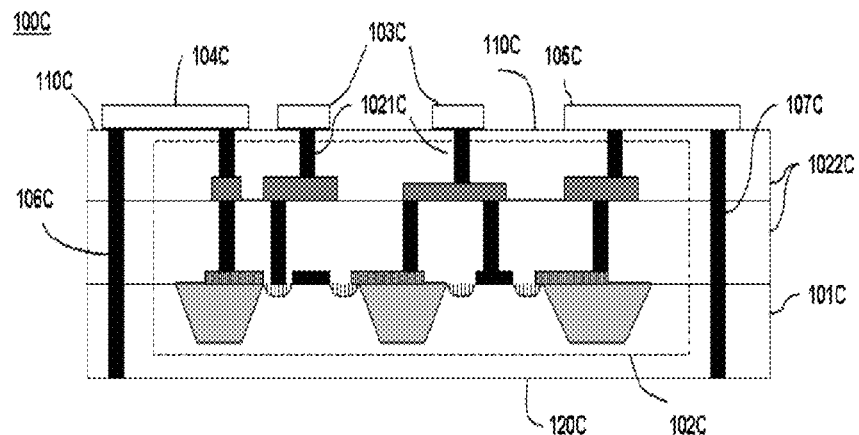

FIGS. 8A to 8B show a schematic view of the process for manufacturing the first through plug 106C and the second through plug 107C according to this embodiment. With reference to FIG. 8A, forming a first through hole 1061C and a second through hole 1071C by etching the control device 100C from the lower surface 120C to the upper surface 110C. Then, a single or multi-layers of metals, metal compounds, or combinations thereof can be filled into the first through hole 1061C and the second through hole 1071C to form the first through plug 106C and the second through plug 107C by CVD, sputter, electro plating or physical vapor deposition (PVD) thin film process, as shown in FIG. 8B. The manufacturing process of the power pad, the first connection pad, and the second connection pad and the manufacturing process of the first through plug and the second through plug can be exchanged, which means that the first and second power pad, first through plug, and second through plug can be completed firstly. In addition, the first through plug and second through plug in order to reduce the interference of integrated circuit block 102C, an insulating region can be firstly formed on the inner wall of the first through hole 1061C and the second through hole 1071C. Then, the single or multi-layers metal of metals, metal compounds, or the combinations thereof are filled into the first through hole 1061C and second through hole 1071C to form the first through plug 106C and the second through plug 107C.

Figure 9A:
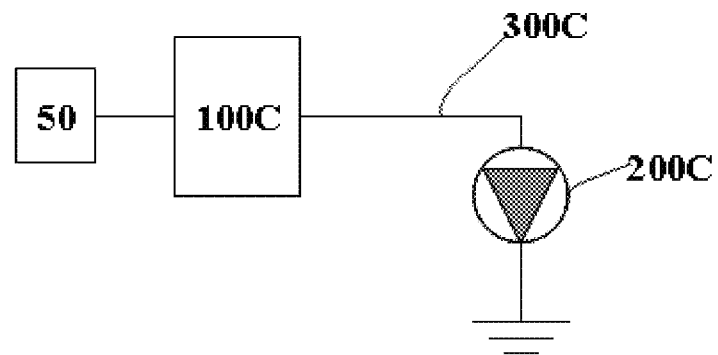
FIGS. 9A to 9B illustrate the corresponding equivalent circuit of one embodiment of the present disclosure
Figure 9B:
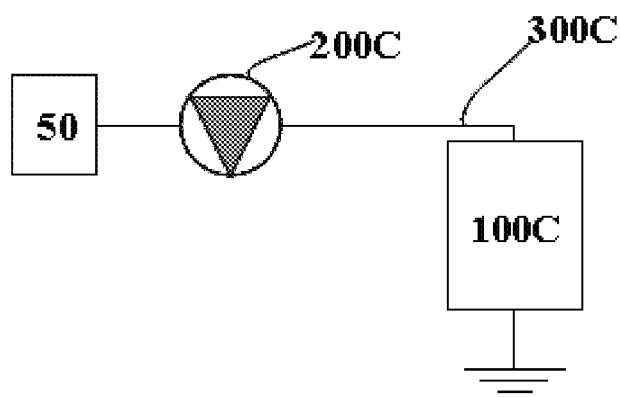

An external DC power source generates current and through the power pad 103C into the light emitting device 10C. FIGS. 9A and 9B show the equivalent circuit diagram of FIGS. 8A and 8B. The control device 100C as a source and light emitting diode 200C as a drain, or the control device 100C as a drain and light emitting diodes as a source 200C. The connector 300C is a circuit electrically connected the control device 100C and the light emitting device 200C.

Forming the first through plug 106C and the second through plug 107C in the control device 100C, and placing the light emitting device 200C near the lower surface of the control device 100C. The first through plug 106C and the second through plug 107C are formed in the non-integrated circuits 102C to avoid the internal complex integrated circuits of control device 100C and to increase the tolerance of the process. Another advantage of this embodiment is that the light emitting device 200C is near the lower surface of the control device 200C so the upper surface of control device 100C have the space to integrate the second control device into a multi-functions system.

As shown in FIG. 10 A, the control device 100D includes a first surface 110D, a second surface 120D, a semiconductor substrate 101D, an integrated circuit block 102D, a plurality of power pads 103D, a first connection pad 104D, and a first through plug 106D. The integrated circuit block 102D includes a plurality of plugs 1021D and a dielectric block 1022D. The first connection pad 104D and the power pads 103D are formed on the first surface 110D, and the first connection pad 104D is electrically connected to the integrated circuit block 102D and the first through plug 106D. The power pad 103D can be electrically connected to an external power supply to import the current into the control device 100D. The first through plug 104D extends from the first surface 110D to the second surface 120D and electrically connected to the first connection pad 104D. The first connection pad 104D and the power pad 103C can be produced in the same steps. The semiconductor substrate 101D includes an extension component 1011D protruding outside of the control device 100D. The dielectric block 1022 contains one or more dielectric layers, wherein the material of dielectric layer 1022 can be silicon oxide ($SiO_x$), silicon nitride ($SiN_x$), titanium dioxide ($TiO_x$), FSG, PSG, BPSG, or alumina ($AlO_x$). Manufacturing methods includes CVD, spin coating, and so on. The method for manufacturing the first through plug 106D and the first through plug 106C of the third embodiment are the same process.

Figure 10A:
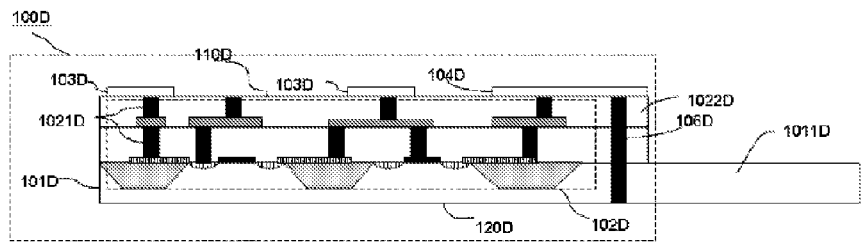
FIGS. 10A to 10D illustrate the corresponding structures fabricated by the manufacturing method according to one embodiment of the present disclosure
Figure 10B:
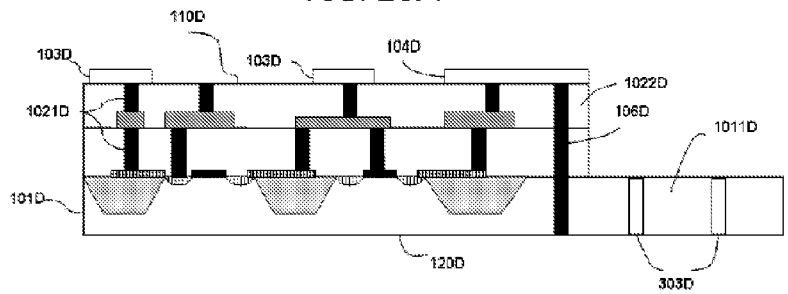
Figure 10C:
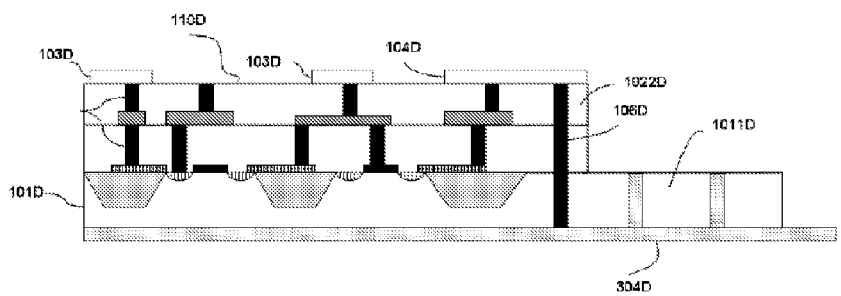
Figure 10D:
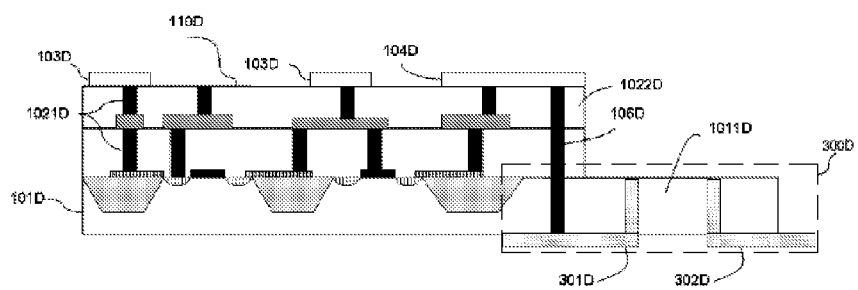

FIGS. 10B-10D show a schematic view of the process for manufacturing the connector 300D. Firstly, forming two connection holes 303D in the extension component 1011D in the semiconductor substrate by photolithography and etching processes, and then forming a conduction layer 304D onto the second surface 120D of control device 100D and filling the connection holes 303D by CVD, sputtering, electro plating, PVD process and their combination, as shown in FIG. 10C.The material of the conduction layer 304D can be single or multi-layer of metals, metal compounds, or combinations thereof. After that, forming the first conductive region 301D and the second conductive region 302D, wherein the first conductive region 301D is electrically connected to the first through plug 106D. In this embodiment, the extension 1011D of the semiconductor substrate in the control device 100D can be used to form the connector 300D, and without additional insulating region to cover the first and second conductive regions.

Figure 11:
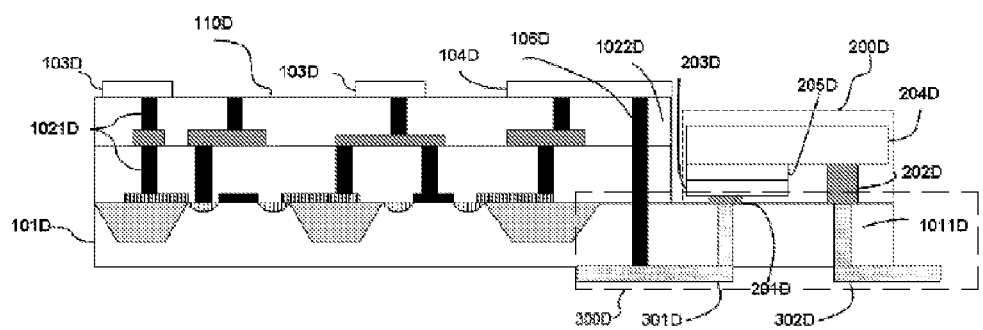
FIG. 11 illustrates an integrated lighting apparatus according to another embodiment of the present disclosure.

FIG. 11 shows a combination of the light emitting device 200D and the control device 100D by the connector 300D to form an integrated light emitting device 10D. The second conductive region 302D of the connector 300D is electrically connected to a second light emitting device after completing of the integrated light emitting devices 10D. Also, the light emitting device 200D is electrically connected to the control device 100D in an extension 1011D of semiconductor substrate so the first surface 110D of the control device 100D can be connected to other components such as a second control element or a second light emitting device.

Figure 12A:
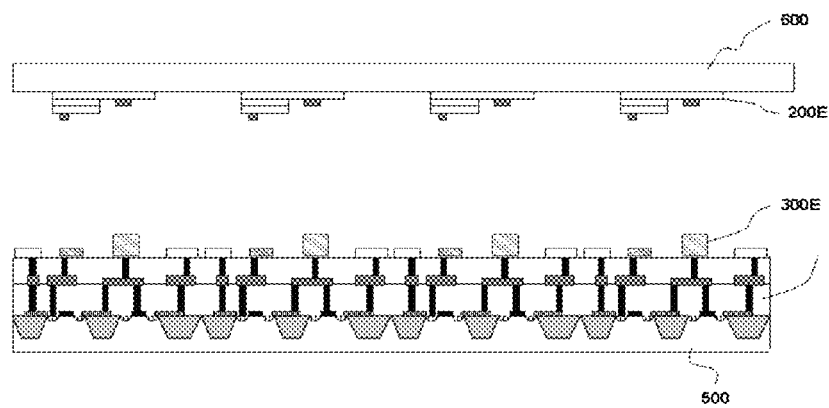
FIGS. 12A to 12B illustrate the corresponding structures fabricated by the manufacturing method according to another embodiment of the present disclosure.
Figure 12B:
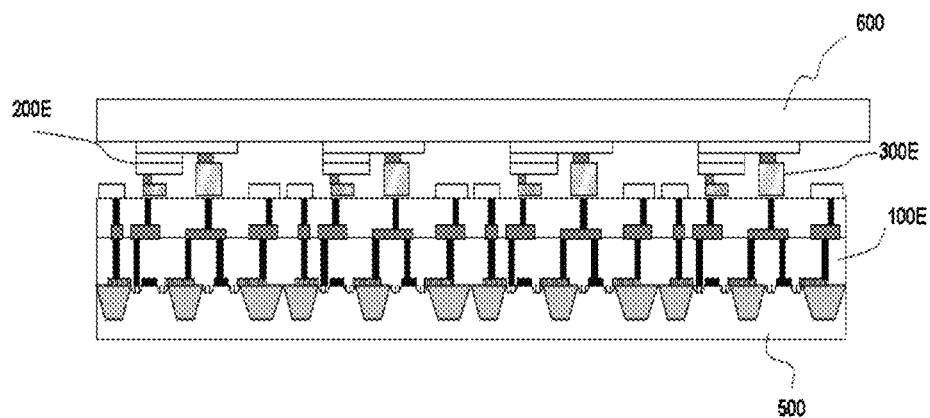
Figure 13:
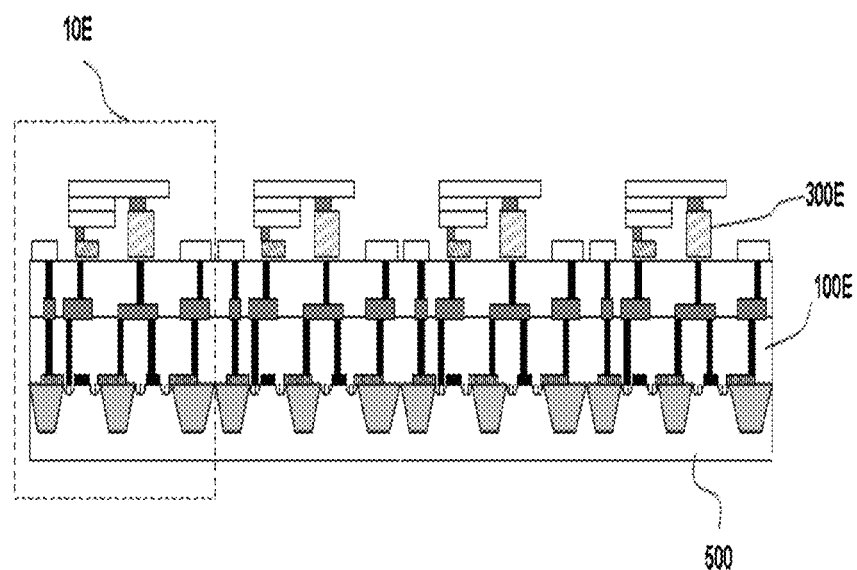
FIG. 13 illustrates an integrated lighting apparatus according to another embodiment of the present disclosure.

As shown in FIGS. 12A-12B, a plurality of control devices 100E and connectors 300E are formed on a semiconductor wafer 500. The manufacturing methods of the control devices 100E and the connectors 300E are similar, such as photolithography, etching, thin film, diffusion, and ion implantation processes. In this embodiment, the manufacturing process is at wafer-level such that a large number of control devices 100E and a plurality of connectors 300E can be completed quickly and at the same time. In this embodiment, further includes a carrier 600 that contains a plurality of light emitting device 200E. As shown in FIG. 12B, the light emitting devices 200E are attached to the connectors 300E by bonding. Finally, the carrier 600 is removed to form a plurality of integrated light emitting devices 10E, as shown in FIG. 13. The plurality of integrated light emitting devices 10E can be cut into a single integrated light-emitting device 10E, or also to cut into a light-emitting system includes more than one integrated light emitting devices 10E.

Figure 14:
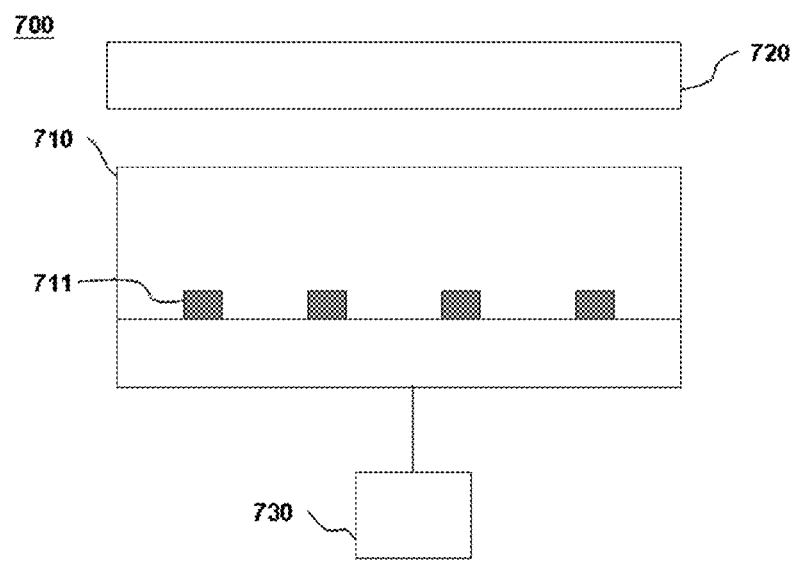
FIG. 14 illustrates an integrated lighting apparatus according to another embodiment of the present disclosure.

FIG. 14 shows a backlight module 700, wherein the backlight module 700 includes a light source device 710 comprising the light-emitting device 711 described in above embodiments of the present disclosure, and an optical device 720 placed on the light path of light source device 710 to process the light appropriately. A power supply system 730 provides the required power to the light source device 710.

Figure 15:
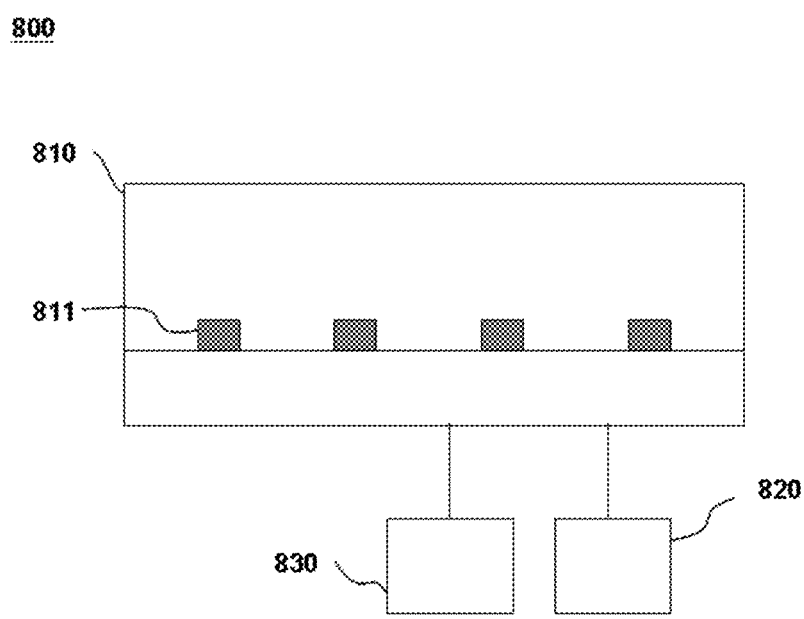
FIG. 15 illustrates an integrated lighting apparatus according to another embodiment of the present disclosure.

FIG. 15 shows a schematic view of a lighting device 800, which can be the lamps of car, street lights, flashlights, an indicator lights, and so on. The light device 800 includes a light source device 811 comprising the light emitting device 810 mentioned above, a power supply system 820 to provide the required power, and a control elements 830 to control the current input.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An integrated lighting apparatus, comprising:
    a first control device including a semiconductor substrate, an integrated circuit block formed above a first portion of the semiconductor substrate, and a plurality of power pads formed above the integrated circuit block;
    a first light emitting device formed above a second portion of the semiconductor substrate; and
    a through plug passing through the semiconductor substrate for electrically connecting the first control device and the first light emitting device.

2. The integrated lighting apparatus according to claim 1, further comprising a connector formed on the second portion of the semiconductor substrate.

3. The integrated lighting apparatus according to claim 2, further comprising a connection hole passing through the semiconductor substrate, and a conduction layer filling the connection hole.

4. The integrated lighting apparatus according to claim 3, wherein the connector is in part on an opposite side of the semiconductor substrate to the first light emitting device, and the connector electrically connects to the first light emitting device by the conduction layer.

5. The integrated lighting apparatus according to claim 4, wherein the through plug connects to the connector.

6. The integrated lighting apparatus according to claim 5, wherein the first control device further comprises a connection pad on the integrated circuit block and connecting the through plug to the integrated circuit block.

7. The integrated lighting apparatus according to claim 4, wherein the first light emitting device comprises an electrode electrically connecting to the connector.

8. The integrated lighting apparatus according to claim 1, wherein the integrated circuit block comprises a plurality of plugs electrically connecting to the plurality of power pads and a dielectric block, wherein the plurality of plugs is embedded in the dielectric block.

9. The integrated lighting apparatus according to claim 8, wherein the dielectric block comprises silicon oxide (SiOx), silicon nitride (SiNx), titanium dioxide (TiOx), FSG, PSG, BPSG, or alumina (AlOx).

* * * * *